(12) United States Patent
Moon

(10) Patent No.: US 8,223,246 B2
(45) Date of Patent: Jul. 17, 2012

(54) REDUCED-COMPONENT DIGITAL IMAGE CAPTURING APPARATUS

(75) Inventor: Hong-ki Moon, Changwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 799 days.

(21) Appl. No.: 12/290,183

(22) Filed: Oct. 28, 2008

(65) Prior Publication Data

US 2009/0141158 A1 Jun. 4, 2009

(30) Foreign Application Priority Data

Dec. 4, 2007 (KR) .......................... 10-2007-0125184

(51) Int. Cl.
*H04N 5/225* (2006.01)
*G03B 17/00* (2006.01)
*G02B 7/02* (2006.01)

(52) U.S. Cl. ........ 348/340; 348/374; 396/529; 396/542; 359/819

(58) Field of Classification Search .................. 348/340, 348/373–376; 396/439, 529, 535, 542; 359/819
See application file for complete search history.

(56) References Cited

U.S. PATENT DOCUMENTS 6,335,759 B1 * 1/2002 Harada .......................... 348/373
2003/0185554 A1 * 10/2003 Nakano et al. ................. 396/235

FOREIGN PATENT DOCUMENTS

| KR | 1996-0028534 A | 7/1996 |
| KR | 2002-0032027 A | 5/2002 |

OTHER PUBLICATIONS

Office Action established for CN 200810179477.5 (Sep. 21, 2011).

* cited by examiner

*Primary Examiner* — Rochelle-Ann J Blackman
(74) *Attorney, Agent, or Firm* — Drinker Biddle & Reath LLP

(57) ABSTRACT

Provided is a digital image capturing apparatus which has a reduced number of components so that manufacture thereof is simplified and manufacturing costs are reduced. The digital image capturing apparatus includes a main printed circuit board (PCB) on which a charge-coupled device (CCD) and a control component for controlling the digital image capturing apparatus are directly mounted. A lens barrel is aligned with the CCD and directly connected with the main PCB.

17 Claims, 5 Drawing Sheets

REDUCED-COMPONENT DIGITAL IMAGE CAPTURING APPARATUS

CROSS-REFERENCE TO RELATED PATENT APPLICATION

This application claims the benefit of Korean Patent Application No. 10-2007-0125184, filed on Dec. 4, 2007, in the Korean Intellectual Property Office, the disclosure of which is incorporated herein in its entirety by reference.

BACKGROUND OF THE INVENTION

1. Field of the Invention

The present invention relates to a digital image capturing apparatus, and more particularly, to a digital image capturing apparatus which has a reduced number of components.

2. Description of the Related Art

When used in a capturing mode, a digital image capturing apparatus stores data regarding an image that is obtained during a capturing operation. In a reproduction mode, the digital image capturing apparatus retrieves the data from a storage medium and displays an image on a display unit by using the data stored in the storage medium.

Conventional digital image capturing apparatuses include an imaging device such as a CCD, a lens barrel with a lens, and other components known in the art. Such apparatuses obtain image data from the charge-coupled device (CCD) when light, which has passed through a lens barrel including a lens, is incident on the CCD.

FIG. 1 is a partially exploded perspective view of a CCD assembly and a lens barrel 5 which are included in a conventional digital image capturing apparatus. FIG. 2 is a cross-sectional view of the CCD assembly illustrated in FIG. 1, taken along line II-II.

Referring to FIGS. 1 and 2, the CCD assembly includes a flexible printed circuit board (FPCB) 1 for a CCD, a CCD 2 mounted on the FPCB 1, and a CCD plate 3 that is interposed between the FPCB 1 and the CCD 2. Such a FPCB 1 for the CCD has a terminal unit 1a at a side part of the FPCB 1. A connector can be connected to the terminal unit 1a so that the FPCB 1 is connected to a main PCB via the connector. As known in the art, one or more integrated circuit (IC) chips including, for example a digital signal processor (DSP) and a central processing unit (CPU) for controlling operation of the conventional digital image capturing apparatus, may be mounted on the main PCB. The CCD 2 includes a terminal unit 2a. As best illustrated in FIG. 2, the terminal unit 2a penetrates the FPCB 1 and is fixed at a rear surface of the FPCB 1 by solder 4. The lens barrel 5 is aligned with the CCD assembly (i.e., the FPCB 1, CCD 2 and CCD plate 3) and is connected to the CCD assembly so that a light passing through the lens barrel 5 can be incident on the CCD 2.

However, when manufacturing the conventional digital image capturing apparatus that includes the CCD assembly and the lens barrel 5 similar to those illustrated in FIGS. 1 and 2, the number of components is increased, the manufacturing process is not easy due to a complicated structure, a yield rate is low, manufacturing costs are greatly increased, and there is a higher probability that some completed digital image capturing apparatuses may be defective.

SUMMARY OF THE INVENTION

The present invention provides a digital image capturing apparatus which has a reduced number of components so that manufacture thereof is simplified and manufacturing costs are reduced.

According to an aspect of the present invention, there a reduced-component digital image capturing apparatus comprises a main printed circuit board (PCB) on which a charge-coupled device (CCD) and a control component for controlling the digital image capturing apparatus are directly mounted.

The CCD may be mounted on the main PCB so that a rear surface of the CCD contacts a surface of the main PCB.

The digital image capturing apparatus may further include a lens barrel, wherein the lens barrel is directly connected to the main PCB so that a light passing through the lens barrel is incident on the CCD mounted on the main PCB.

The digital image capturing apparatus may further include a first connection component which connects the lens barrel and the main PCB.

The digital image capturing apparatus may further include: a frame; and a top PCB on which a button correspondence component, which corresponds to a button disposed on a top part of the digital image capturing apparatus, is mounted. The top PCB may be disposed on a top part of the frame, and the main PCB is disposed on a side part of the frame.

The digital image capturing apparatus may further include a second connection component which connects the top PCB and the frame.

The digital image capturing apparatus may further include a third connection component which connects the main PCB and the frame.

The top PCB and the main PCB may respectively further include a first connector and a second connector which are electrically connected to each other so that the top PCB and the main PCB are electrically connected to each other.

The top PCB and the main PCB may be respectively connected to the frame so that the first connector and the second connector are engaged with each other.

DETAILED DESCRIPTION OF THE INVENTION

The present invention will now be described more fully with reference to the accompanying drawings, in which exemplary embodiments of the invention are shown.

Figure 3:
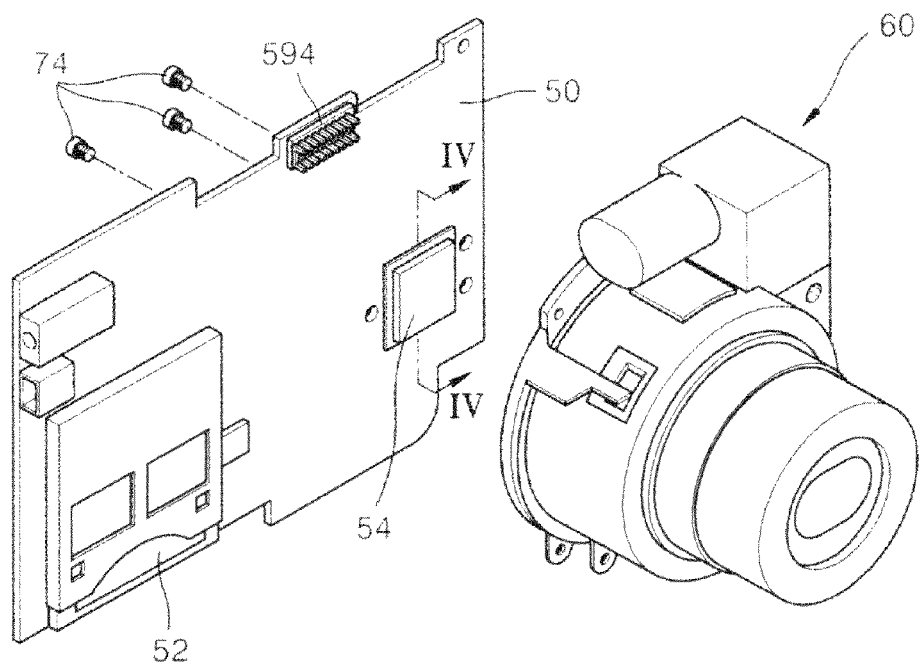
FIG. 3 is a partially exploded perspective view of a main printed circuit board (PCB) and a lens barrel, which are included in a digital image capturing apparatus according to an embodiment of the present invention.
Figure 4:
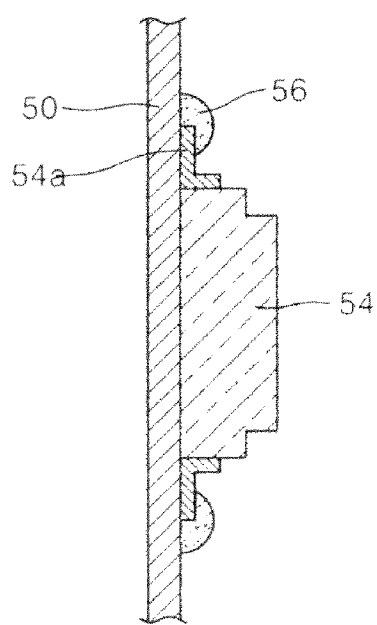
FIG. 4 is a cross-sectional view of the PCB illustrated in FIG. 3, taken along line IV-IV.
Figure 5:
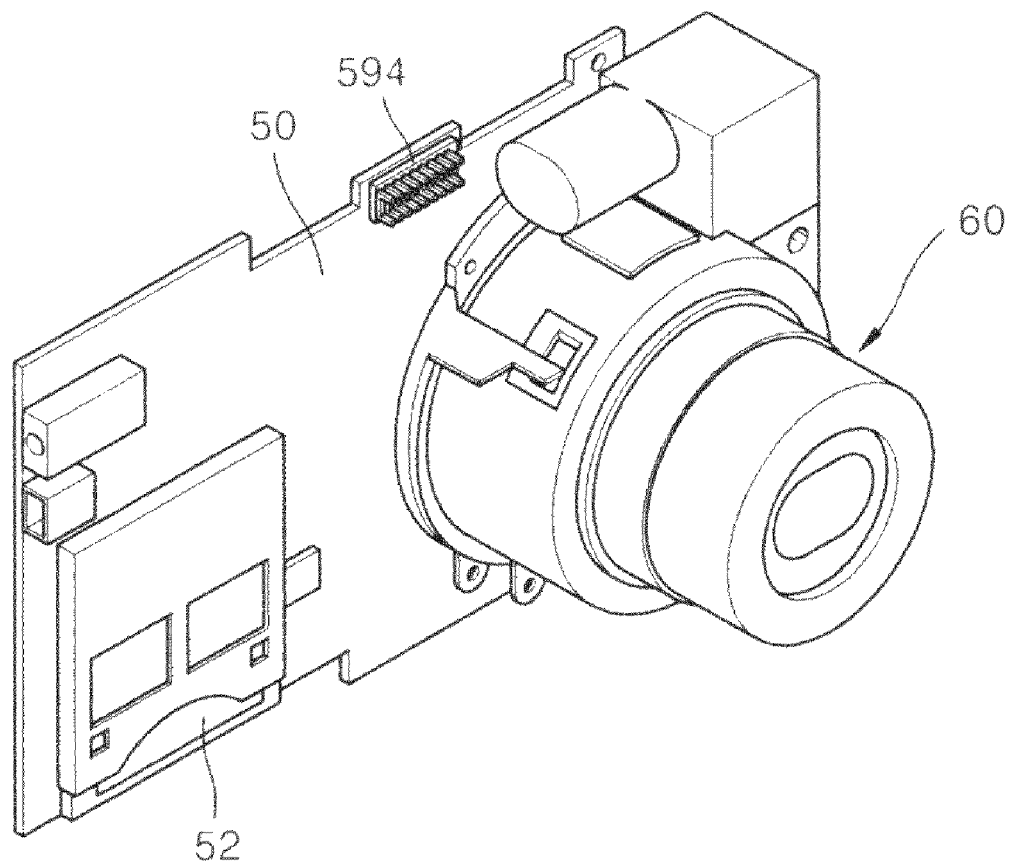
FIG. 5 is a front perspective view of a main PCB-lens barrel assembly in which the main PCB and the lens barrel illustrated in FIG. 3 are connected to each other.

FIG. 3 is a partially exploded front perspective view of a main printed circuit board (PCB) 50 and a lens barrel 60 which are included in a digital image capturing apparatus according to an embodiment of the present invention. FIG. 4 is a cross-sectional view of the PCB illustrated in FIG. 3, taken along line IV-IV. FIG. 5 is a front perspective view of a main PCB-lens barrel assembly in which the main PCB 50 and the lens barrel 60 illustrated in FIG. 3 are connected to each other.

Figure 1:
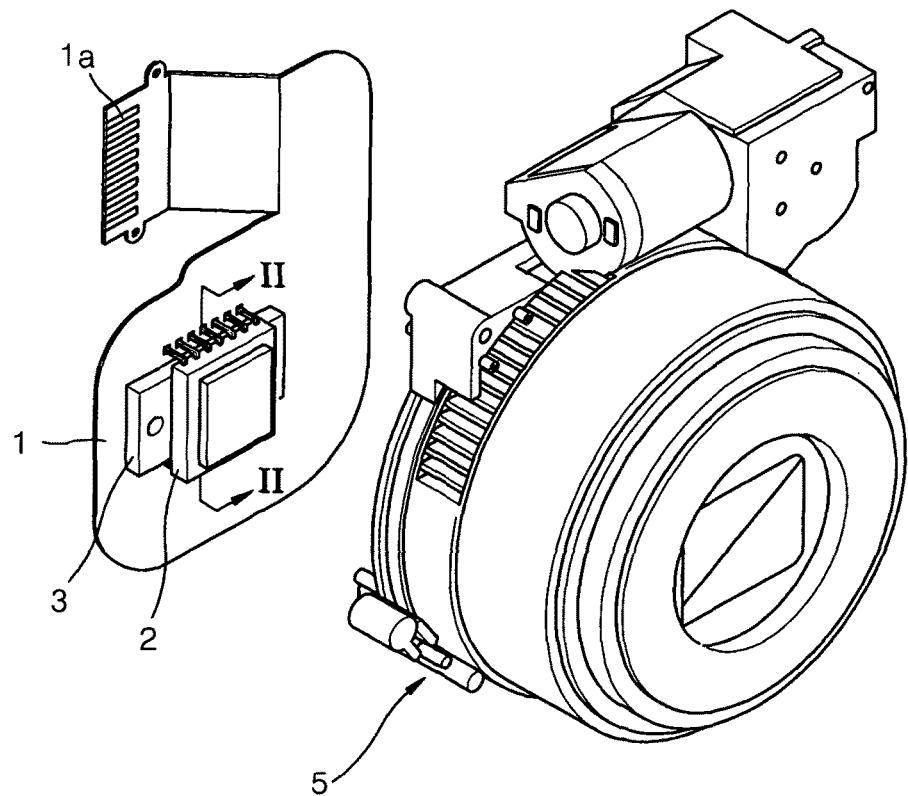
FIG. 1 is a partially exploded perspective view of a charge-coupled device (CCD) assembly and a lens barrel, which are included in a conventional digital image capturing apparatus.
Figure 2:
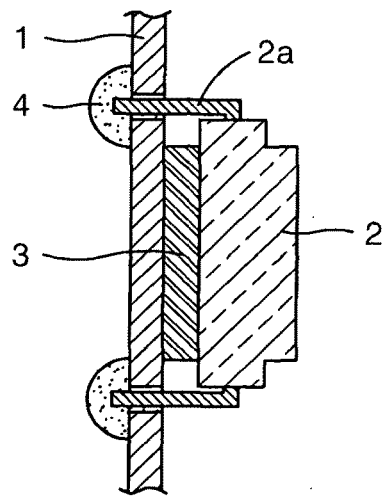
FIG. 2 is a cross-sectional view of the CCD assembly illustrated in FIG. 1, taken along line II-II.

Referring to FIGS. 3 through 5, similar to conventional digital image capturing apparatuses the digital image capturing apparatus according to the present invention includes the main PCB 50 and a control component 52 for controlling the digital image capturing apparatus. The control component 52 is directly mounted on the main PCB 50. However, instead of mounting the charge-coupled device (CCD) 54 to a separate circuit board (e.g., the FPCB 1 as shown in FIGS. 1 and 2), the main PCB 50 of the digital image capturing apparatus according to the present invention also has the CCD 54 directly mounted thereto. That is, compared to a conventional digital image capturing apparatus in which a CCD assembly including a flexible PCB (FPCB) 1 for a CCD, a CCD 2 mounted on the FPCB for the CCD, and a CCD plate 3 interposed between the CCD 2 and the FPCB 1 is manufactured and then the CCD assembly is connected to a main PCB via a connector, the CCD 54 is directly mounted on the main PCB 50 in the digital image capturing apparatus according to the present invention. Thus, unlike the conventional digital image capturing apparatus illustrated in FIG. 1, the digital image capturing apparatus according to the present invention does not require the FPCB 1 for the CCD, the CCD plate 3, or a connector (not shown) which connects the main PCB and the FPCB 1 via the terminal unit 1a. Accordingly, when compared to the conventional digital image capturing apparatus, the digital image capturing apparatus according to the present invention has a fewer total number of components so that a structure is simplified, manufacture is more easily performed, a failure occurrence rate is reduced, and manufacturing costs in mass production are greatly reduced.

As previously mentioned, the conventional digital image capturing apparatus illustrated in FIG. 2 includes the CCD 2 with a terminal unit 2a. The terminal unit 2a penetrates the FPCB 1 and is fixed to a rear surface of the FPCB 1 by solder 4. The CCD plate 3 is interposed between the FPCB 1 and the CCD 2 so that the CCD 2 is not damaged before the CCD assembly is connected to the main PCB due to the FPCB 1 being flexible. Other reasons for interposing the CCD plate 3 between the FPCB 1 and the CCD 2 is that a position of the CCD 2 is not fixed or handling is not easy in a solder process, since the FPCB 1 is flexible. Also, another reason for interposing the CCD plate 3 between the FPCB 1 and the CCD 2 is that the CCD plate 3 and the main PCB are connected by using a connection component via a hole formed on CCD plate 3 so that the CCD assembly is fixed to the main PCB.

However, in the case of the digital image capturing apparatus according to the present invention, as illustrated in FIGS. 3 and 4, the CCD 54 is directly mounted on the main PCB 50 that is not flexible (i.e., the PCB 50 includes a rigid substrate), and thus, a separate CCD plate is not required. Also, as illustrated in FIG. 4, the CCD 54 is mounted on the main PCB 50 so that a rear surface of the CCD 54 contacts a surface of the main PCB 50 that is not flexible. Hence, a space is not formed between the CCD 54 and the main PCB 50. Since the main PCB 50 onto which the CCD 54 mounted is not flexible, handling is not difficult in a process of fixing a terminal unit 54a of the CCD 54 to the main PCB 50 by a solder 56.

As further shown in FIG. 3, the digital image capturing apparatus according to the present invention may further include a lens barrel 60 which includes a lens, a diaphragm, etc. As is best illustrated in FIG. 5, the lens barrel 60 is directly connected to the main PCB 50. By doing so, a light passing through the lens barrel 60 is incident on the CCD 54 that is mounted on the main PCB 50. As shown in FIG. 3, the lens barrel 60 and the main PCB 50 may be connected by using a first connection component 74 such as one or more fasteners (e.g., three screws as shown). For example, the lens barrel 60 and the main PCB 50 may be connected in the vicinity of the CCD 54 by using the first connection component 74, which is inserted through one or more holes defined in the PCB 50. Since the light passing through the lens barrel 60 has to be properly incident on the CCD 54, alignment between the lens barrel 60 and the CCD 54 is highly important. In the case of the digital image capturing apparatus according to the present invention, the CCD 54 is directly mounted on the main PCB 50, and thus, the alignment between the lens barrel 60 and the CCD 54 may be exactly adjusted when the lens barrel 60 and the main PCB 50 fit together.

Figure 6:
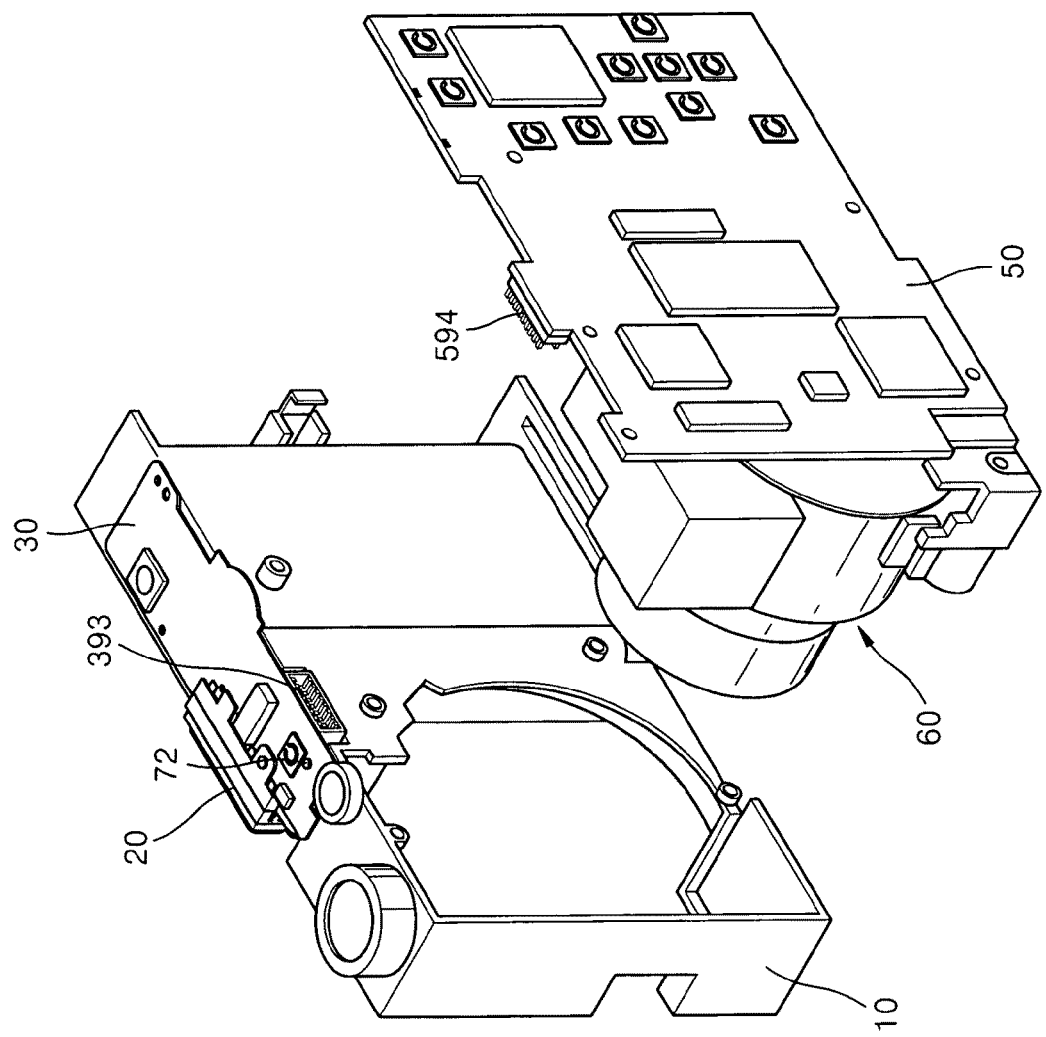
FIG. 6 is a partially exploded rear perspective view of a frame, a top PCB assembly which is connected to the frame, and the main PCB-lens barrel assembly of FIG. 5.
Figure 7:
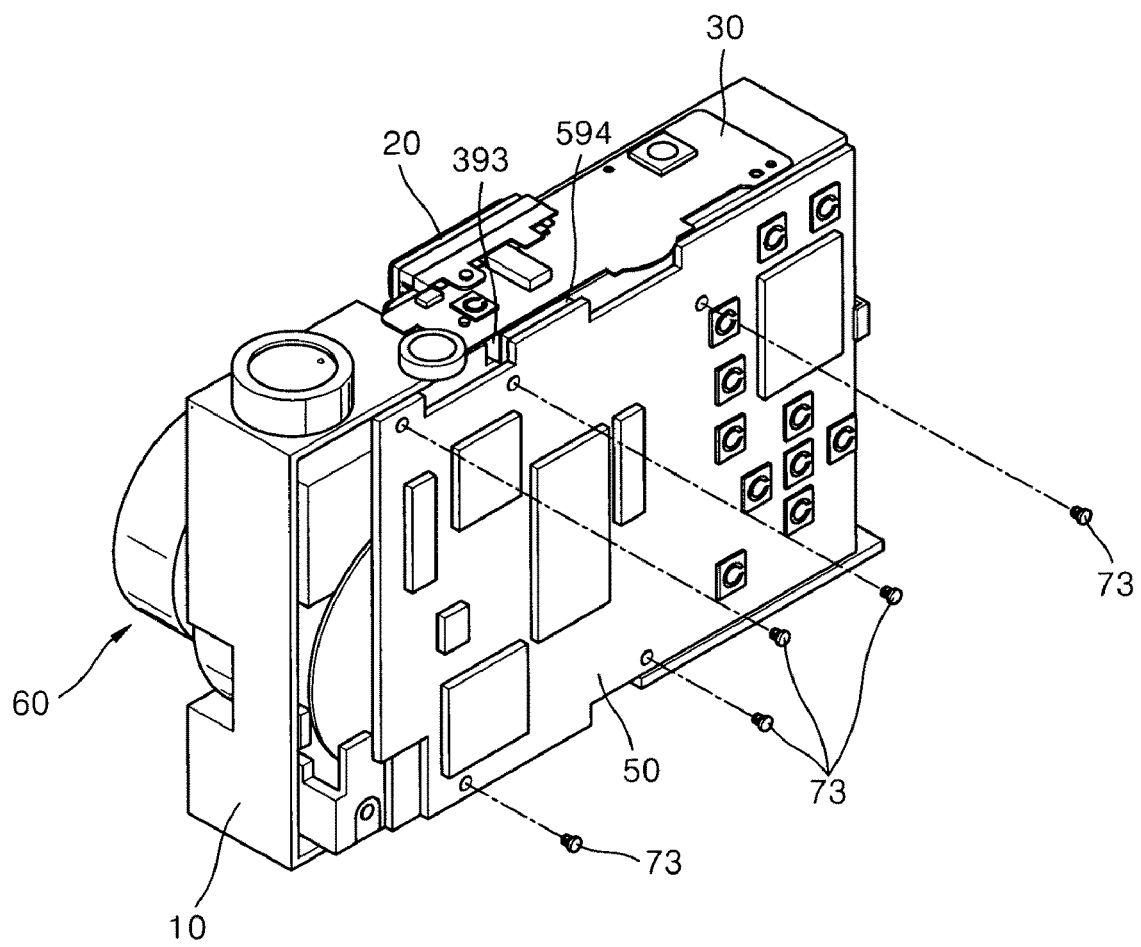
FIG. 7 is a rear perspective view of an example in which the main PCB-lens barrel assembly is connected to the frame to which a top PCB is connected.

FIG. 6 is a partially exploded rear perspective view of a digital image capturing apparatus according to the present invention that includes a frame 10, a top PCB assembly 30 which is connected to the frame 10, and the main PCB-lens barrel assembly 50, 60. FIG. 7 is a rear perspective view of an example in which the main PCB-lens barrel assembly 50, 60 is connected to the frame 10 to which the top PCB 30 is connected.

Referring to FIGS. 6 and 7, the digital image capturing apparatus according to the present invention may further include the frame 10 and the top PCB 30. A button correspondence component, which corresponds to a button (or buttons) disposed on a top part of the digital image capturing apparatus, is mounted on the top PCB 30 which is disposed on a top part of the frame 10. As illustrated in FIGS. 6 and 7, the top PCB 30 may be connected to the frame 10 by using a second connection component 72 such as a fastener (e.g., a screw as shown). As further shown, a flash module 20 including a flash lamp may be fitted with the top PCB 30. The main PCB 50 is vertically configured and disposed at a side part of the frame 10 (i.e., the side opposite to the side including an aperture through which the lens barrel 60 extends). The top PCB 30 is horizontally oriented and disposed at a top part of the frame 10. As best shown in FIG. 7, the main PCB 50 may be connected to the frame 10 by using a third connection component 73 such as one or more fasteners (e.g., five screws as shown).

As best shown in FIG. 6, the top PCB 30 includes a first connector 393 and the main PCB 50 includes a second connector 594. The first connector 393 and the second connector 594 are physically coupled and electrically connected to each other when the main PCB-lens barrel assembly 50, 60 is connected to the frame 10, thereby enabling the top PCB 30 and the main PCB 50 to communicate with each other. In particular, as illustrated in FIG. 7, the top PCB 30 is connected to the frame 10 on the top part of the frame 10, and the main PCB 50 is connected to the frame 10 on the side part of the frame 10, so that the first connector 393 and the second connector 594 are automatically engaged with each other (referred to as 'Board to Board connection'), and thus a separate electrical connection means need not be included. Unlike the conventional digital image capturing apparatus in which a flash lamp in a flash module is electrically connected to the main PCB via wires or a separate FPCB with a terminal unit and a corresponding connector, the digital image capturing apparatus according to the present invention electrically connects the flash module 20 to the main PCB 50 via the top PCB 30. Accordingly, the number of components is reduced and the structure is simplified such that manufacture may be more easily performed to provide an increased yield rate, decreased failure occurrence, and reduced costs.

The present invention can embody a digital image capturing apparatus that has a reduced number of components, that is simple to manufacture, and that has low manufacturing costs.

While this invention has been particularly shown and described with reference to exemplary embodiments thereof, it will be understood by those of ordinary skill in the art that various changes in form and details may be made therein without departing from the spirit and scope of the invention as defined by the appended claims.

What is claimed is:

1. A digital image capturing apparatus comprising:
    a main printed circuit board including a rigid substrate;
    a control component directly mounted on the rigid substrate, the control component being operable for controlling operation of the digital image capturing apparatus;
    a charge-coupled device directly mounted on the rigid substrate;
    a frame including a top portion and a front portion, the top and front portions defining a recess configured to receive the main printed circuit board; and
    a second printed circuit board configured on the top portion, the second printed circuit board including a button correspondence component that couples with a button disposed on a top part of the digital image capturing apparatus,
    wherein the main printed circuit board is configured in the frame generally parallel to the front portion, the main printed circuit board and the second printed circuit board being generally perpendicular to each other.

2. The digital image capturing apparatus of claim 1, wherein a substantial entirety of a rear surface of the charge-coupled device contacts a surface of the main printed circuit board.

3. The digital image capturing apparatus of claim 1, further comprising a lens barrel, the lens barrel being connected to the main printed circuit board and aligned with the charge-coupled device such that light passing through the lens barrel is incident on the charge-coupled device.

4. The digital image capturing apparatus of claim 3, further comprising a first connection component connecting the lens barrel and the main printed circuit board.

5. The digital image capturing apparatus of claim 1, further comprising a second connection component connecting the second printed circuit board and the frame.

6. The digital image capturing apparatus of claim 1, further comprising a third connection component connecting the main printed circuit board and the frame.

7. The digital image capturing apparatus of claim 1, wherein the main printed circuit board includes a first connector and wherein the second printed circuit board includes a second connector, the first and second connectors being configured to engage with each other for electrically connecting the main and second printed circuit boards.

8. The digital image capturing apparatus of claim 7, wherein the first and second connectors are configured to engage with each other upon disposing the main printed circuit board in the recess.

9. The digital image capturing apparatus of claim 1, further comprising a flash module including a flash lamp, the flash module being electrically and mechanically coupled with the second printed circuit board.

10. The digital image capturing apparatus of claim 1, wherein the control component and the charge-coupled device are spaced apart from each other and directly mounted on the same surface of the rigid substrate.

11. A method for assembling a digital image capturing apparatus comprising:
    mounting a control component to a first surface of a printed circuit board;
    mounting a charge-coupled device to the first surface of the printed circuit board, the charge-coupled device being spaced apart from the control component;
    aligning a lens barrel with the charge-coupled device such that light passing through the lens barrel is incident on the charge-coupled device;
    attaching the lens barrel to the printed circuit board in alignment with the charge-coupled device;
    configuring a frame with a top portion and a front portion, the top and front portions defining a recess configured to receive the printed circuit board;
    coupling a second printed circuit board on the top portion of the frame configured to retain the printed circuit board, the second printed circuit board including a button correspondence component that couples with a button disposed on a top part of the digital image capturing apparatus; and
    disposing the printed circuit board in the recess.

12. The method of claim 11 wherein the disposing step comprises engaging a first connector on the printed circuit board with a second connector on the second printed circuit board for electrically connecting the control component with the button correspondence component.

13. The method of claim 11, further comprising coupling a flash module including a flash lamp with the second printed circuit board.

14. A reduced-component digital image capturing apparatus comprising:
    a frame including a vertically-oriented side portion, a horizontally-oriented top portion perpendicular to the side portion, and a vertically-oriented front portion perpendicular to the side and top portions, the side, top and front portions defining a recess;
    a first printed circuit board on the top portion of the frame, the first printed circuit board including a first connector and a button correspondence component electrically connected with the first connector, the button correspondence component being configured to couple with a button disposed on a top part of the digital image capturing apparatus;
    a second printed circuit board including a rigid substrate, the second printed circuit board being vertically disposed in the recess;
    a control component directly mounted on a surface of the rigid substrate, the control component being operable for controlling operation of the digital image capturing apparatus;
    a charge-coupled device directly mounted on the surface of the rigid substrate; and
    a second connector directly mounted on the surface of the rigid substrate, the second connector being configured to engage with the first connector upon disposing the second printed circuit board in the recess.

15. The apparatus of claim 14, further comprising a lens barrel, the lens barrel being connected to the main printed circuit board and aligned with the charge-coupled device such that light passing through the lens barrel is incident on the charge-coupled device,
    wherein the front portion of the frame includes an aperture configured to receive the lens barrel.

16. The apparatus of claim 14, further comprising a flash module including a flash lamp, the flash module being electrically connected with the first printed circuit board for receiving control signals from the control component relative to an input signal from the button correspondence component.

17. The apparatus of claim 14, wherein the control component and the charge-coupled device are spaced apart from each other on the rigid substrate.

* * * * *